(12) United States Patent
Hwang et al.

(10) Patent No.: US 8,766,207 B2
(45) Date of Patent: Jul. 1, 2014

(54) BEAM MONITORING DEVICE, METHOD, AND SYSTEM

(75) Inventors: Chih-Hong Hwang, New Taipei (TW); Chun-Lin Chang, Hsinchu County (TW); Nai-Han Cheng, Hsinchu (TW); Chi-Ming Yang, Hsinchu (TW); Chin-Hsiang Lin, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 277 days.

(21) Appl. No.: 13/241,392

(22) Filed: Sep. 23, 2011

(65) Prior Publication Data

US 2013/0075624 A1 Mar. 28, 2013

(51) Int. Cl.
*H01J 37/244* (2006.01)

(52) U.S. Cl.
USPC ............... 250/397; 250/492.1; 250/492.22; 250/492.3

(58) Field of Classification Search
USPC .................. 250/397, 492.1–492.3
See application file for complete search history.

(56) References Cited

U.S. PATENT DOCUMENTS

| | | | |
|---|---|---|---|
| 2003/0197132 A1* | 10/2003 | Keum et al. | 250/492.21 |
| 2004/0262532 A1* | 12/2004 | Krueger | 250/397 |
| 2006/0097195 A1* | 5/2006 | Angel et al. | 250/492.21 |
| 2012/0126137 A1* | 5/2012 | Shen | 250/397 |

* cited by examiner

*Primary Examiner* — Michael Maskell
(74) *Attorney, Agent, or Firm* — Haynes and Boone, LLP

(57) ABSTRACT

A beam monitoring device, method, and system is disclosed. An exemplary beam monitoring device includes a one dimensional (1D) profiler. The 1D profiler includes a Faraday having an insulation material and a conductive material. The beam monitoring device further includes a two dimensional (2D) profiler. The 2D profiler includes a plurality of Faraday having an insulation material and a conductive material. The beam monitoring device further includes a control arm. The control arm is operable to facilitate movement of the beam monitoring device in a longitudinal direction and to facilitate rotation of the beam monitoring device about an axis.

20 Claims, 15 Drawing Sheets

BEAM MONITORING DEVICE, METHOD, AND SYSTEM

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of devices having doped regions. An ion implantation process is well suited for doping. Ion implantation adds dopant atoms in a material using energetic ion beam injection. It is important to achieve uniform implantation. If the implantation is not uniform, the dopant profile and ultimately the electronic device may be adversely affected. One reason why implantation may not be uniform is because the angle of incidence if the ion beam varies. For example, the incidence angle of an ion beam may vary because of beam blow-up. Beam blow-up occurs because as the ion beam travels from the source chamber the positive ions within the ion beam to mutually repel each other. Such mutual repulsion causes a beam of otherwise desired shape to diverge away from an intended beamline path. Consequently, it is desirable to monitor the incidence angle of the ion beam in an ion implanter so that control of the ion implantation process may be improved. Although existing devices and methods of monitoring ion beam incidence angle have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
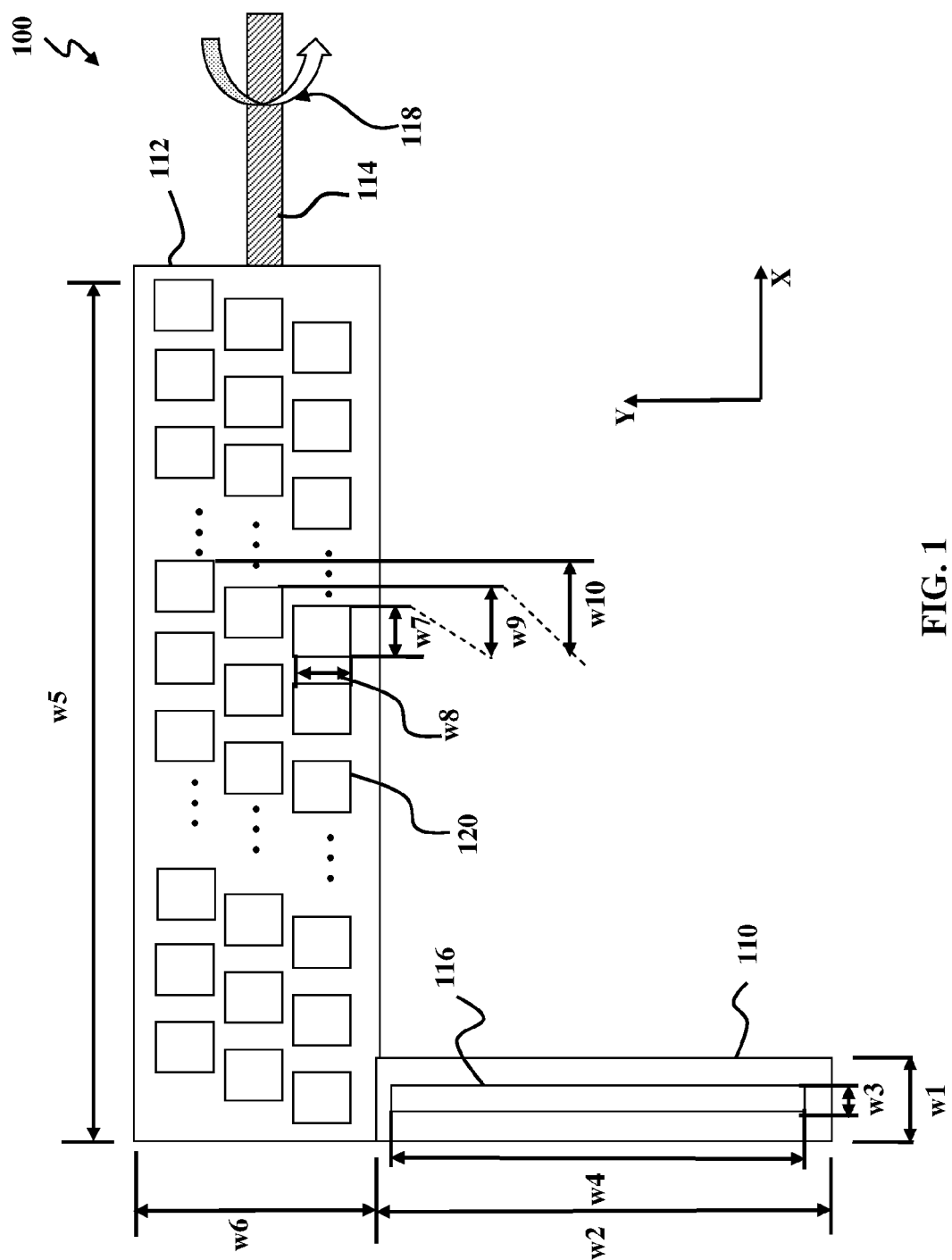
FIG. 1 is a diagrammatic front view of one embodiment of a beam monitoring device, according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of systems that can benefit from one or more embodiments of the present invention are systems that monitor a beam source. Such a system, for example, is a system that monitors an ion beam source. The ion beam source, for example, may be used in a manufacturing process to implant ions in semiconductor devices. The following disclosure will continue with an example of a device that monitors an ion beam, to illustrate various embodiments of the present invention. It is understood, however, that the claimed invention should not be limited to a particular type of device, except as specifically claimed.

FIGS. 1-15 have been simplified for the sake of clarity to better understand the inventive concepts of the present disclosure. FIG. 1 is a diagrammatic front view of one embodiment of a beam monitoring device 100, according to various aspects of the present disclosure. Additional features can be added to the beam monitoring device 100, and some of the features described below can be replaced or eliminated in other embodiments of the beam monitoring device 100.

With reference to FIG. 1, in the present embodiment the beam monitoring device 100 includes a one dimensional (1D) profiler 110, a two dimensional (2D) profiler 112, and a control arm 114. As will be further discussed below, the 1D profiler 110 has two functions. First, the 1D profiler 110 scans a 1D cross sectional profile of the ion beam as the control arm 114 moves the 1D profiler in the X direction across an ion beam. Second, the 1D profiler 110 monitors the incidence angle of the ion beam in the X direction as the control arm 114 moves the 1D profiler in the X direction across the ion beam. In the present embodiment, the X direction is along the length of the ion beam. In alternative embodiments, the X direction is along the width of the ion beam.

Still referring to FIG. 1, the 1D profiler 110 includes a Faraday 116. The Faraday 116 has an entrance aperture which allows an ion beam to pass through. The flux of the ion beam is sampled and a current is generated by the Faraday 116. The 1D profiler 110 has a dimension in the X direction of w1 and a dimension in the Y direction of w2. The Faraday 116 has a dimension in the X direction of w3 and a dimension in the Y direction of w4. In the present embodiment, the 1D profiler 110 has a dimension w1 of about 5 millimeters (mm) and a dimension w2 of about 86 mm. The Faraday 116 has a dimension w3 of about 3 mm and a dimension w4 of about 80 mm. It is understood that the present embodiment is not limiting and that the 1D profiler 110 and the Faraday 116 may be designed to have different measurements. For example, the 1D profiler may be designed such that the Faraday 116 has a dimension w4 that allows a complete perpendicular cross-sectional area of the beam (i.e., perpendicular to the length of the beam) to pass through and thereby measure the angle of incidence across the perpendicular cross-sectional area in one monitoring pass. It is also understood that, depending on design requirements, the 1D profiler 110 may include a plurality of Faraday 116.

With further reference to FIG. 1, the beam monitoring device 100 includes a 2D profiler 112. As will be discussed in more detail below, the 2D profiler 112 has three functions. First, the 2D profiler 112 monitors the width of the ion beam. Second, the 2D profiler scans a 2D cross sectional profile of the ion beam as the control arm 114 moves the 2D profiler 112 in the Y direction across the ion beam. And, third, the 2D profiler monitors the incidence angle of the ion beam in the Y direction as the control arm 114 rotates about its axis 118. In the present embodiment, the Y direction is along the width of the ion beam. In alternative embodiments, the Y direction is along the length of the ion beam.

The 2D profiler 112 includes a plurality of Faraday 120. The Faraday 120 of the 2D profiler 112 are arranged in a grid pattern. The grid pattern may be substantially symmetrical in nature. The grid pattern may be formed by having the Faraday 120 aligned such that the 2D profiler 112 looks like it has streets running in the north and south direction intersecting at approximately ninety (90) degrees. Alternatively, the grid pattern may be formed by having the Faraday 120 offset one to another in one direction and substantially aligned in the other direction. In the present embodiment, the grid pattern is formed by having the Faraday 120 offset one to another in the Y direction and substantially aligned in the X direction. The disclosed patterns are, of course, merely examples and are not intended to be limiting. Accordingly, the Faraday 120 disclosed herein may be arranged or configured in ways different from the exemplary embodiments shown herein without departing from the scope of the present disclosure.

The 2D profiler 112 has a dimension in the X direction of w5 and a dimension in the Y direction of w6. The Faraday 120 has a dimension in the X direction of w7 and a dimension in the Y direction of w8. In the present embodiment, the grid pattern of the 2D profiler 112 is formed such that the Faraday in the first adjacent column is offset by a w9 dimension in the X direction and the Faraday in the second adjacent column is offset by a w10 dimension in the X direction. The dimensions of the 2D profiler may be designed such that the 2D profiler substantially covers half of a beam cross-sectional area in the X direction and a whole beam cross-sectional area in the Y direction. In the present embodiment, the 2D profiler has a w5 dimension of about 255 mm and a w6 dimension of about 7 mm. The Faraday 120 has w7 dimension of about 3 mm and a w8 dimension of about 1 mm. The grid pattern of the 2D profiler 112 has a w9 dimension of about 1 mm and a w10 dimension of about 1 mm. In the present embodiment, the 2D profiler 112 has a w5 dimension of 225 mm such that the 2D profiler 112 substantially covers at least half of a diameter of a 450 mm wafer. It is understood that the present embodiment is not limiting and that the 2D profiler 112 and the Faraday 120 may by designed to have different measurements. By way of a nonlimiting example, as wafer manufacturing technology advances, the wafer may be designed with a new diameter such that a 2D profiler with a 255 mm dimension may not be able to substantially cover at least half of the wafer's diameter. In such circumstances, it may be desirable to design the 2D profiler with a w5 dimension such that it spans half of the wafer's new diameter.

With continued reference to FIG. 1, the monitoring device 100 includes a control arm 114. The control arm 114 allows movement of the monitoring device 100 during operation. The control arm 114 allows the monitoring device 100 to move in the X and Y direction. Further, the control arm 114 allows the monitoring device 100 to bi-directionally rotate about its axis 118. The control arm 114 may be formed to any suitable thickness and of any suitable material. For example, the control arm may be formed to a thickness and of a material such that the control arm 114 is able to sustain the weight of the monitoring device 100 without any substantial flexing.

Figure 2:
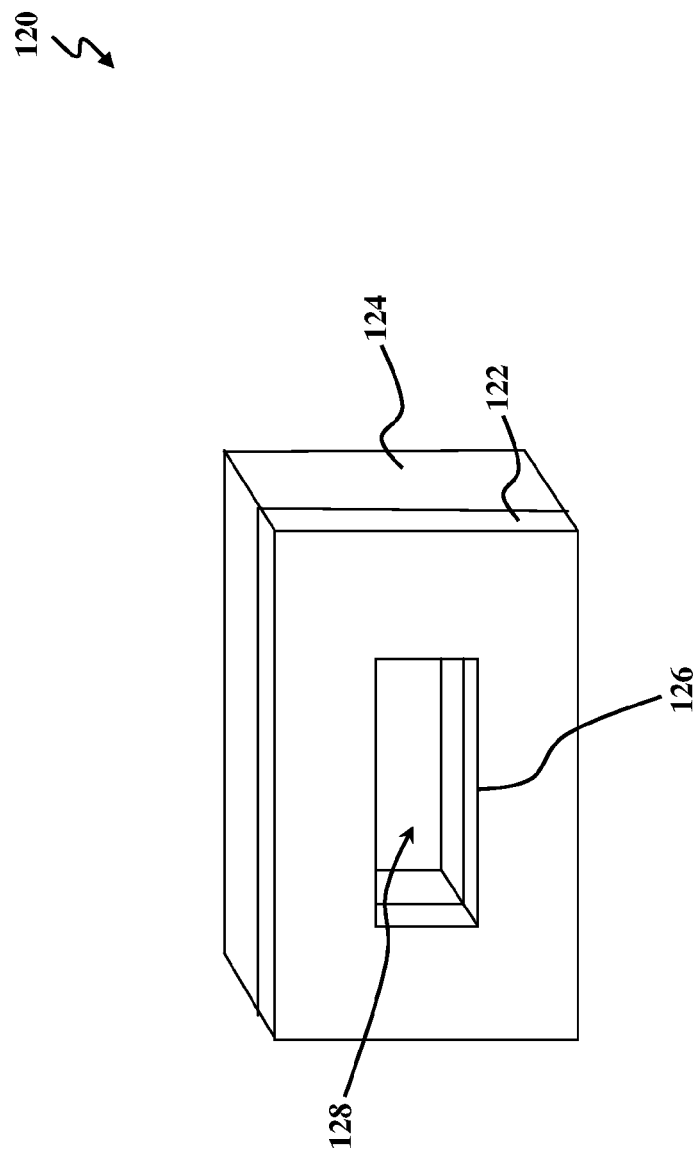
FIG. 2 illustrates a perspective view of one embodiment of a Faraday of FIG. 1, according to various aspects of the present disclosure.

Referring to FIG. 2, a perspective view of one embodiment of a Faraday 120 of FIG. 1 is illustrated, according to various aspects of the present disclosure. The Faraday 120 includes an insulation material 122, a conductive material 124, and cup structure 126. The cup structure 126 has an opening 128 and a plurality of walls that extend into the conductive material 124. Opposing the opening 128 is a bottom surface, formed in the conductive material 124, that has a plane substantially parallel with a plane of the opening 128. The insulation material 122 covers the conductive material 124 not exposed by the opening 126 such that a ion beam (not depicted) is prohibited from striking the conductive material 124. The opening 126 allows the beam to strike the bottom surface and the plurality of walls formed in the conductive material 124 and thereby induce a current in the Faraday 120.

Figure 3:
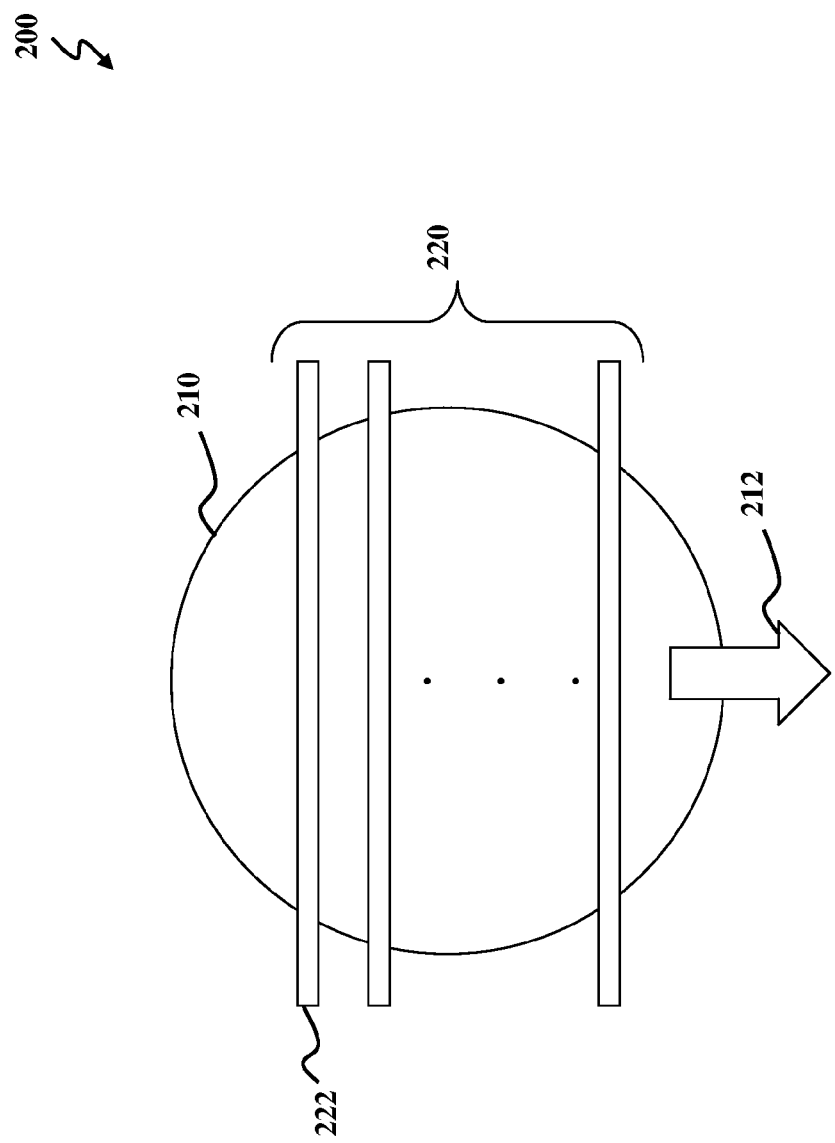
FIG. 3 is a diagrammatic view of one embodiment of a wafer in an implantation system, according to various aspects of the present disclosure.

Referring to FIG. 3, a diagrammatic view of one embodiment of a wafer in an implantation system is illustrated, according to various aspects of the present disclosure. The implantation system 200 includes a wafer 210 and a ion beam source 220. The wafer 210 may include a semiconductor substrate with various devices thereon. The ion beam source 220 includes an ion generating unit 222 that generates an ion beam for implanting the wafer 210. The ion beam source 220 may include a single ion generating unit 222 or a n-number of ion generating units 222. During implantation, the ion beam source 220 is held in a fixed position while the wafer 210 is moved along in an orthogonal direction (indicated by the arrow 212) to cause the ion beam from the ion beam generating unit 222 to scan over the wafer 210 and thereby implant the wafer 210 with ions. Depending on the number of ion generating units 222 and the desired implantation dopant level, the scanning process may be performed numerous times to repeatedly expose the wafer 210 to the ion beam.

Figure 4:
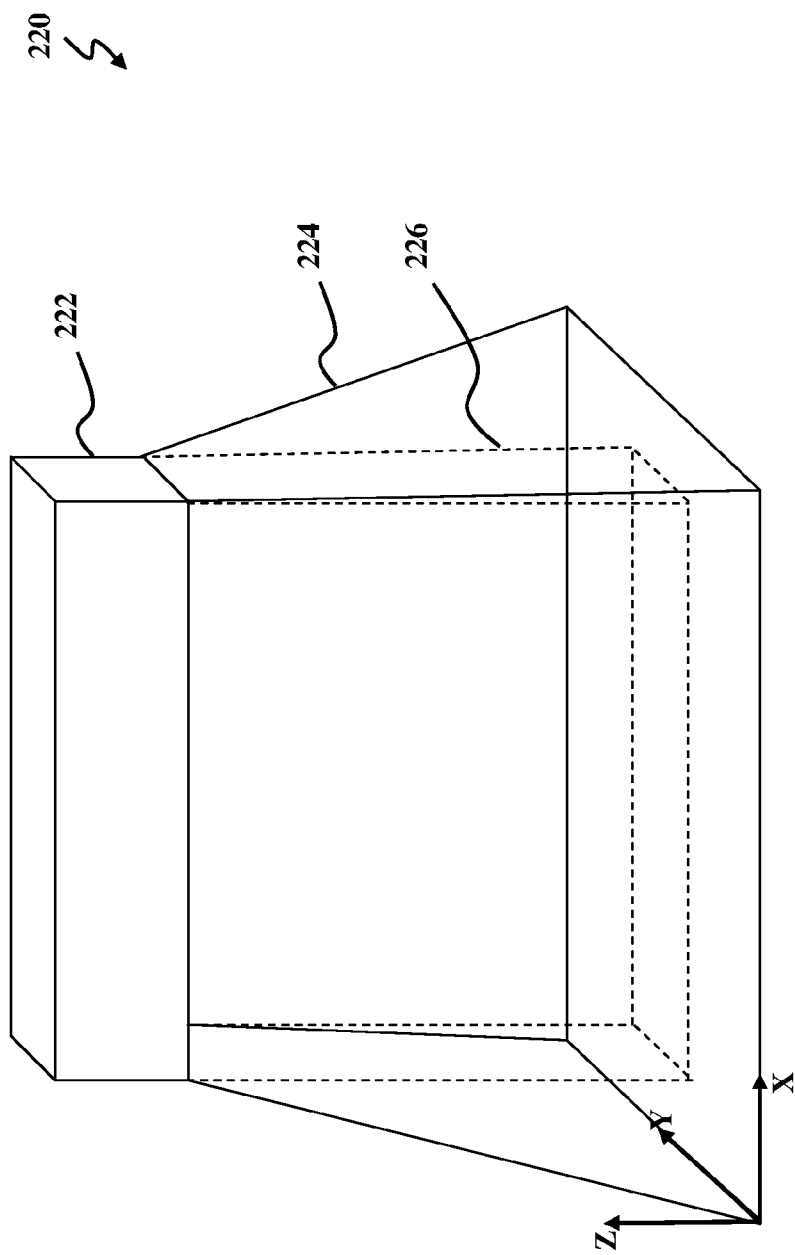
FIGS. 4-6 illustrate diagrammatic cross-sectional side views of one embodiment of a beam source and beam angles, according to various aspects of the present disclosure.
Figure 5:
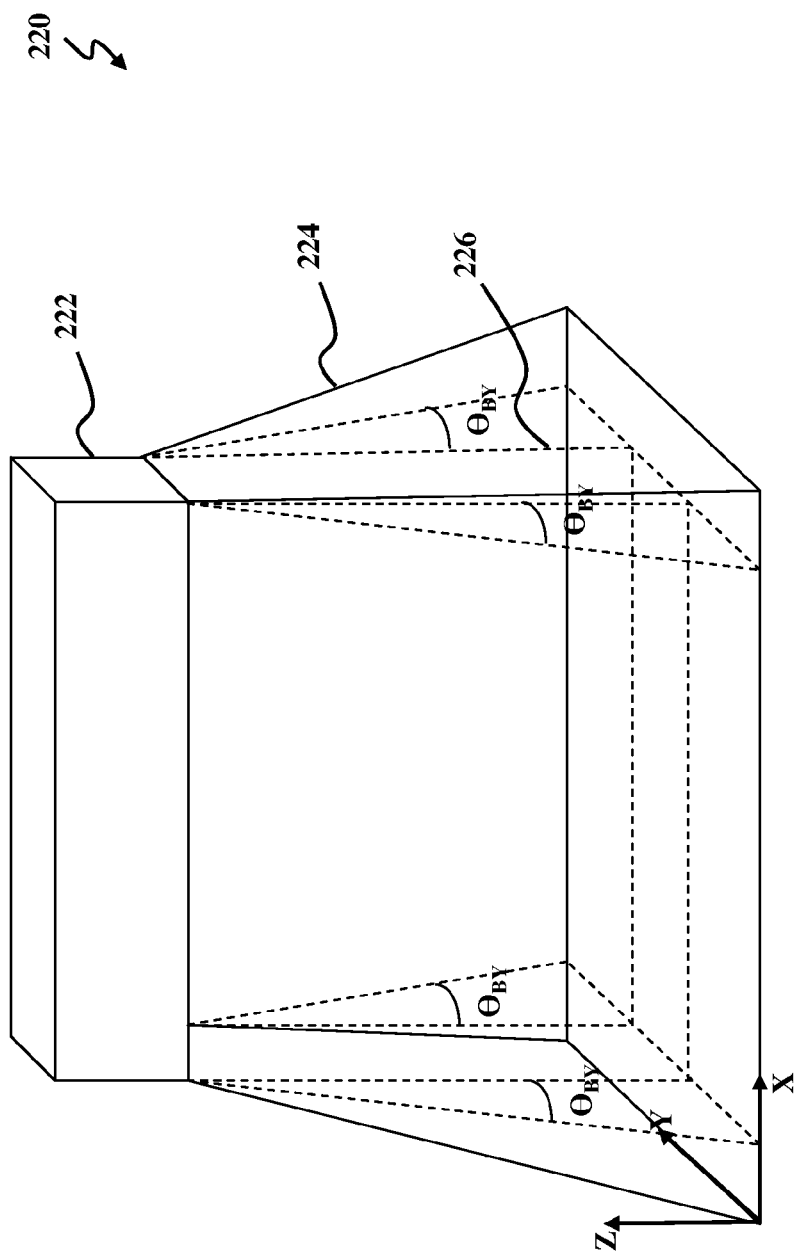
Figure 6:
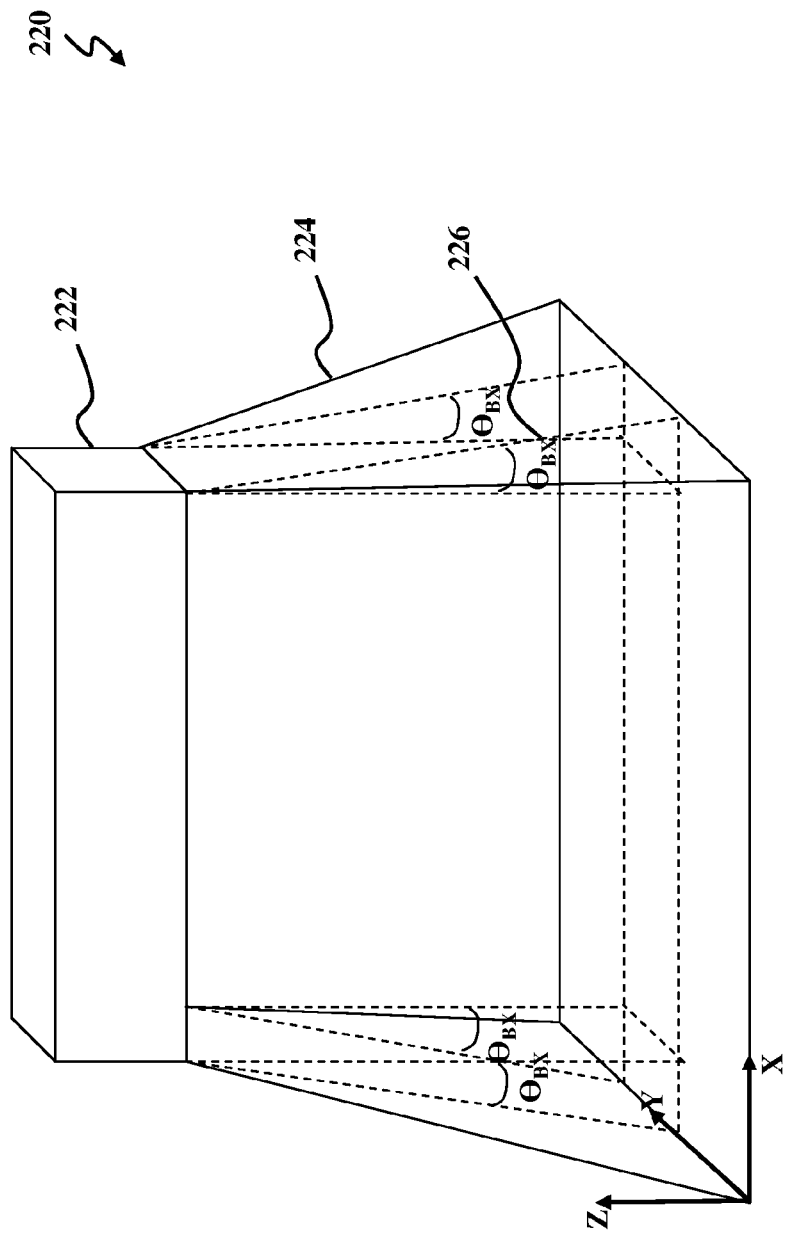
Figure 7:
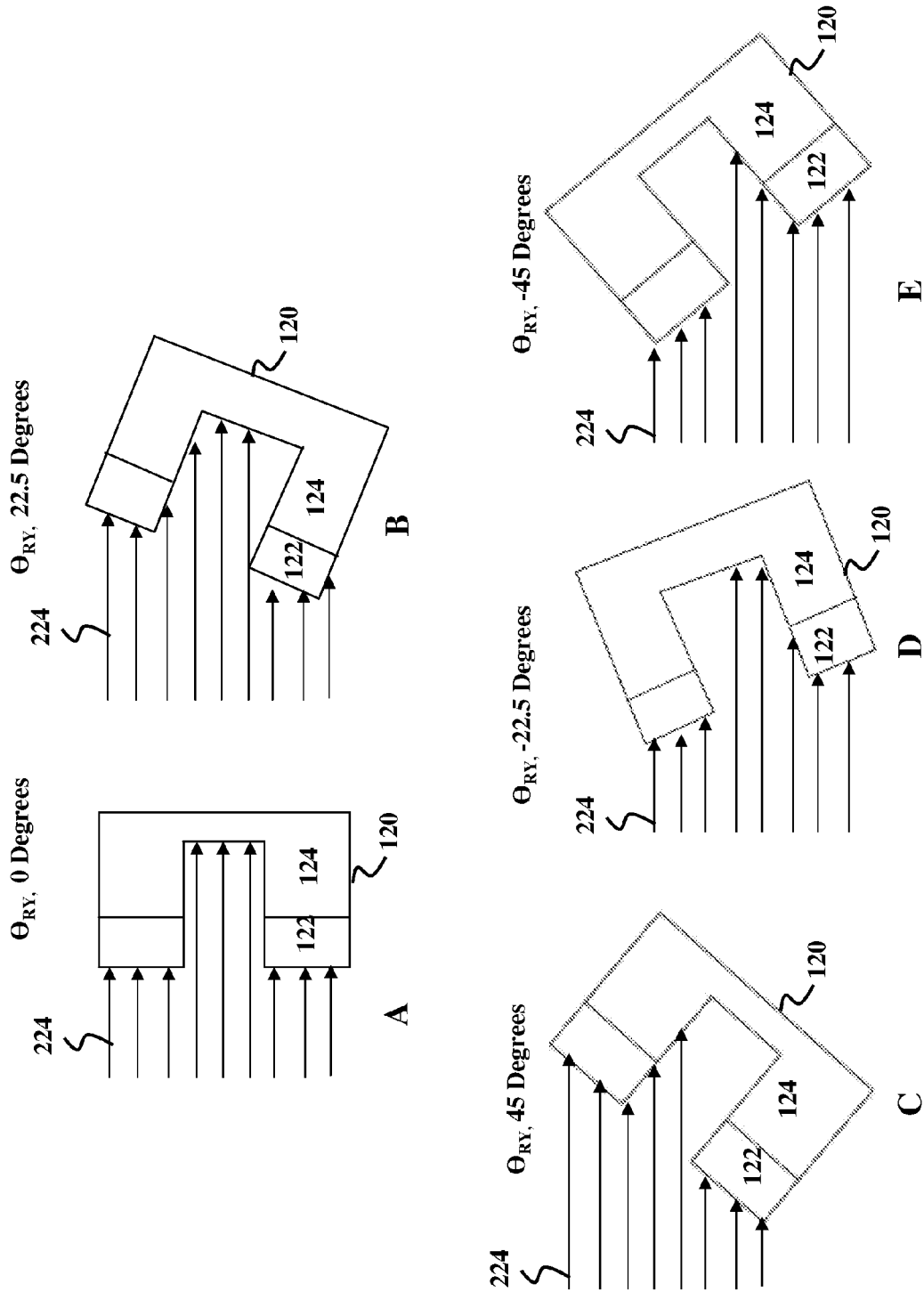
FIG. 7 illustrates a diagrammatic cross-sectional side view of one embodiment of a Faraday and rotation angle, according to various aspects of the present disclosure.

FIGS. 4-6 illustrate diagrammatic cross-sectional side views of one embodiment of a beam source and beam angles, according to various aspects of the present disclosure. Referring to FIG. 4, a beam source is illustrated. In the present embodiment, the beam source is an ion beam source 220. The ion beam source 220 includes an ion generating unit 222 that generates an ion beam 224 of charged particles in the −Z direction toward a wafer (not shown). The ion beam 224 experiences a blow-up effect such that the ion beam 224 does not have the same angel of incidence as an ideal angle of incidence from an ideal beam 226 which does not experience a blow-up effect.

Referring to FIG. 5, the angle of incidence $\theta_{BY}$ of the ion beam 224 is illustrated. The beam angle of incidence $\theta_{BY}$ is the angle between the ion beam 224 and the ideal beam 226 in the Y direction. Because the ion beam 224 is approximately linear the ion beam angle of incidence $\theta_{BY}$ can be measured on both sides and across the length of the ion beam 224.

Referring to FIG. 6, the angle of incidence $\theta_{BX}$ of the ion beam 224 is illustrated. The angle of incidence $\theta_{BX}$ is the angle between the ion beam 224 and the ideal beam 226 in the X direction. Because the ion beam 224 is approximately linear the ion beam angle of incidence $\theta_{GX}$ can be measured on both sides and across the width of the ion beam 224.

Referring to FIG. 7A-E, illustrated is a diagrammatic cross-sectional side view of one embodiment of a Faraday 120 with a rotation angle $\theta_{RY}$ (rotation of the Faraday 120) in the Y direction and an ion beam 224 with an angle of incidence $\theta_{BY}$ in the Y direction. In the illustrated embodiment, the ion beam angle of incidence $\theta_{BY}$ is 0 degrees. Faraday 120 has a rotation angle $\theta_{RY}$ in the Y direction of 0 degrees (A), +−22.5 degrees (B, D), and +−45 degrees (C, E). As illustrated, the ion beam 224 strikes the front of the Faraday 120. The part of the ion beam 224 that strikes the insulation material 122 is blocked and does not induce a current in the Faraday 120. The part of the ion beam 224 that enters the opening of the Faraday 120 and strikes the surface of the conductive material 124 induces a current in the Faraday 120.

Figure 8:
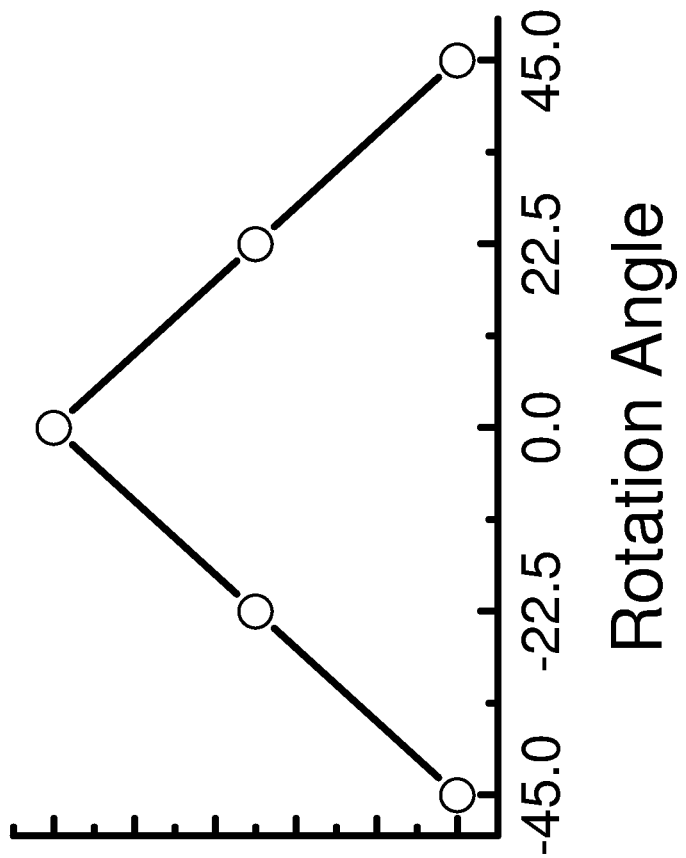
FIG. 8 is a graph illustrating the current of the Faraday of FIG. 7 with respect to a rotation angle, according to one embodiment of the present disclosure.
Figure 9:
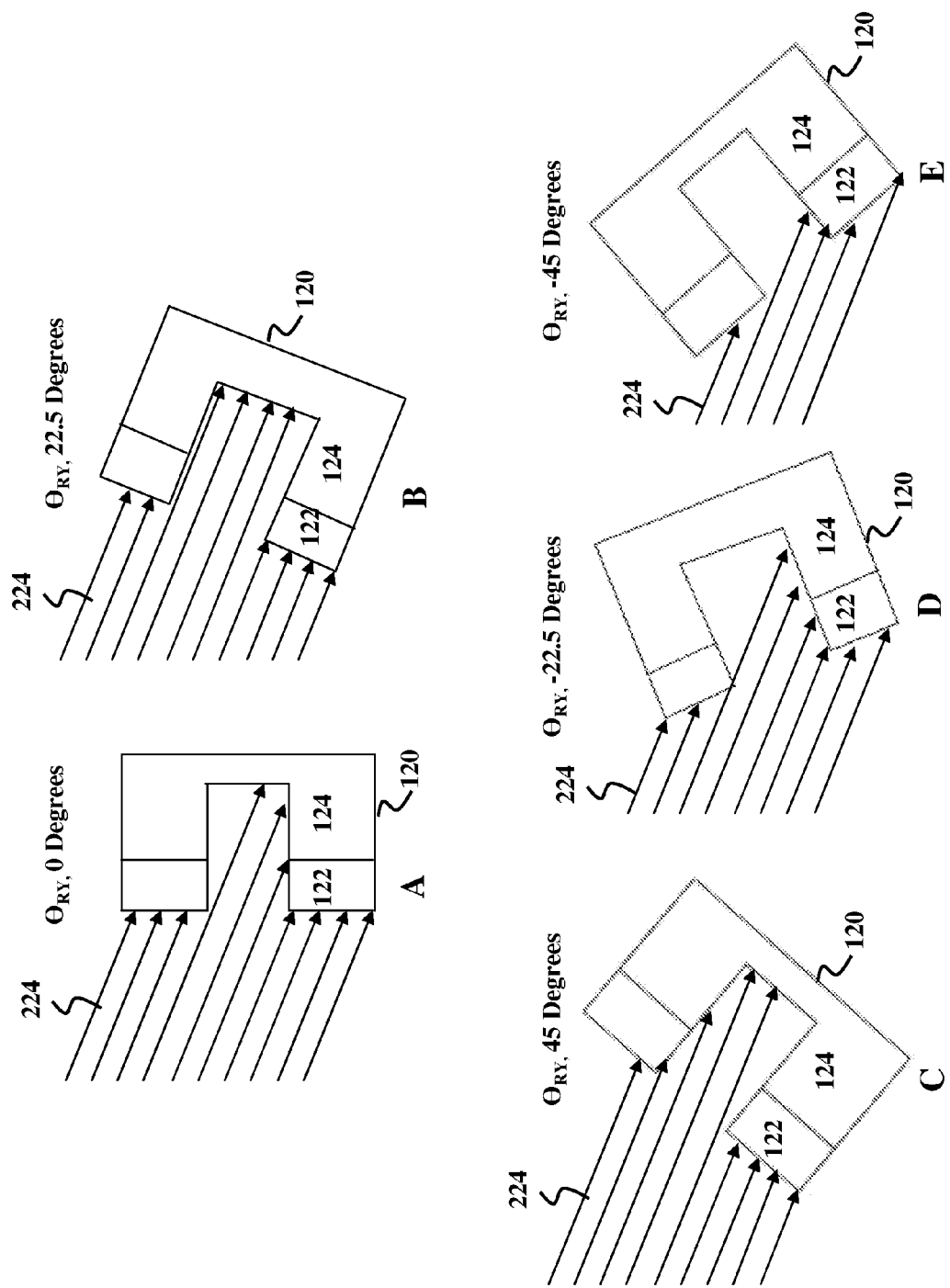
FIG. 9 illustrates a diagrammatic cross-sectional side view of one embodiment of a Faraday and rotation angle, according to various aspects of the present disclosure.

FIG. 8 is a graph illustrating the current of the Faraday 120 of FIG. 7A-E with respect to a rotation angle $\theta_{RY}$ in the Y direction, according to one embodiment of the present disclosure. As illustrated, at a rotation angle $\theta_{RY}$ of 0 degrees, the current in the Faraday 120 is at a maximum. On the other hand, at a rotation angle $\theta_{RY}$ of 45/−45 degrees, the current in the Faraday 120 is at a minimum. The rotation angle $\theta_{RY}$ of 22.5/−22.5 degrees, produces a current in the Faraday 120 that is between the maximum and the minimum values.

Referring to FIG. 9A-E, illustrated is a diagrammatic cross-sectional side view of one embodiment of a Faraday 120 with a rotation angle $\theta_{RY}$ (rotation of the Faraday 120) in the Y direction and an ion beam 224 with an angle of incidence $\theta_{BY}$ in the Y direction. In the illustrated embodiment, the ion beam angle of incidence $\theta_{BY}$ is 22.5 degrees. Faraday 120 has a rotation angle $\theta_{RY}$ in the Y direction of 0 degrees, +−22.5 degrees, and +−45 degrees. As illustrated, the ion beam 224 strikes the front of the Faraday 120. The part of the ion beam 224 that strikes the insulation material 122 is blocked and does not induce a current in the Faraday 120. The part of the ion beam 224 that enters the opening of the Faraday 120 and strikes the surface of the conductive material 124 induces a current in the Faraday 120.

Figure 10:
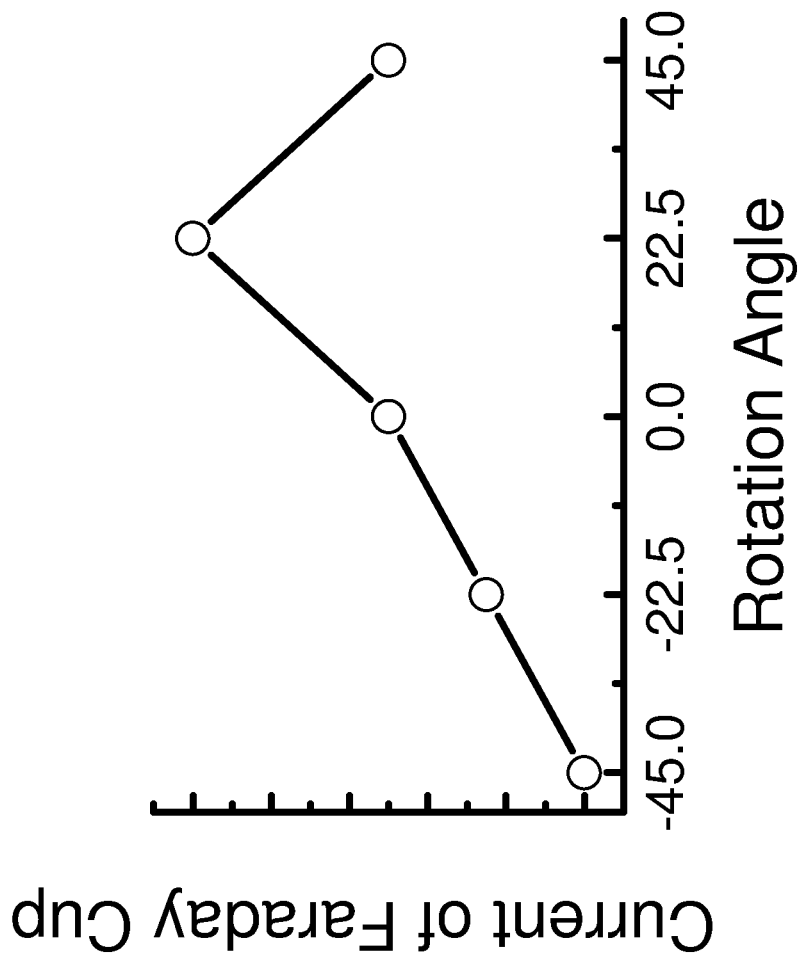
FIG. 10 is a graph illustrating the current of the Faraday of FIG. 9 with respect to a rotation angle, according to one embodiment of the present disclosure.

FIG. 10 is a graph illustrating the current of the Faraday 120 of FIG. 9A-E with respect to a rotation angle $\theta_{RY}$ in the Y direction and a ion beam angle of incidence $\theta_{BY}$ of 22.5 degrees, according to one embodiment of the present disclosure. As illustrated, at a rotation angle $\theta_{RY}$ of 22.5 degrees and a ion beam angle of incidence $\theta_{BY}$ of 22.5 degrees, the current in the Faraday 120 is at a maximum. On the other hand, at a rotation angle $\theta_{RY}$ of −45 degrees and a ion beam angle of incidence $\theta_{BY}$ of 22.5 degrees, the current in the Faraday 120 is at a minimum (approaching 0). The rotation angle $\theta_{RY}$ of 0 and 45 degrees, produces a current in the Faraday 120 that is between the maximum and the minimum values.

With the above embodiment, it is possible to monitor the ion beam angle of incidence $\theta_{BY}$ in the Y direction by measuring the current of the Faraday 120. For example, as an ion beam is generated, the Faraday may be rotated about an axis in the +−Y direction to a rotation angle $\theta_{RY}$ such that the maximum current is produced in the Faraday 120. Because the maximum current of the Faraday 120 occurs when the ion beam has an angle of 0 with respect to the surface of the Faraday 120 (i.e., $\theta_{RY}=\theta_{BY}$), the ion beam angle of incidence $\theta_{BY}$ in the Y direction may be determined.

Figure 11:
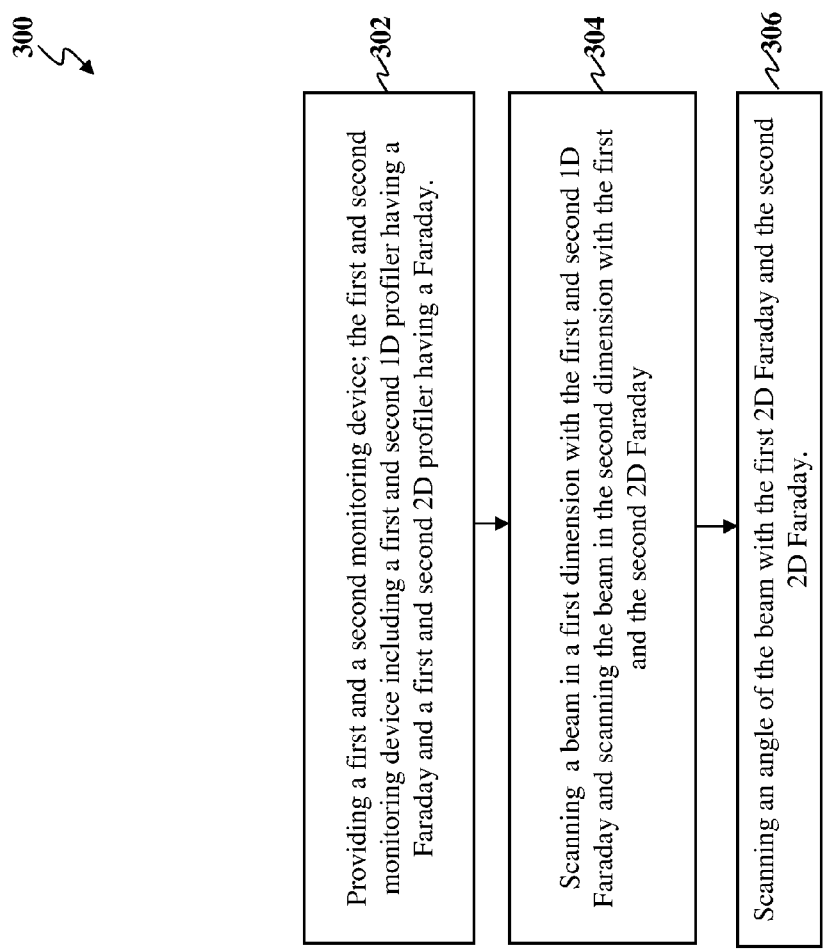
FIG. 11 is a flowchart illustrating a method of monitoring a beam, according to various aspects of the present disclosure.

FIG. 11 is a flow chart of a method 300 for monitoring a beam according to various aspects of the present disclosure. In the present embodiment, the method 300 is used to monitor an ion beam. It is understood that the method 300 may be advantageously applicable in monitoring other beams. The method 300 begins at block 302 where a first and a second monitoring device is provided. The first monitoring device includes a first 1D profiler and a first 2D profiler and the second monitoring device includes a second 1D profiler and a second 2D profiler. The first 1D profiler includes a first 1D Faraday and the first 2D profiler includes a first 2D Faraday. The second 1D profiler includes a second 1D Faraday and the second 2D profiler includes a second 2D Faraday. At block 304 a beam having a first and a second dimension is scanned. Scanning the beam includes scanning the beam in the first dimension with the first 1D Faraday and the second 1D Faraday and scanning the beam in the second dimension with the first 2D Faraday and the second 2D Faraday. The method continues with block 306 where an angle of the beam is scanned with the first 2D Faraday and the second 2D Faraday. Additional steps can be provided before, during, and after the method 300, and some of the steps described can be replaced or eliminated for other embodiments of the method. The discussion that follows illustrates various embodiments of a system that may benefit from the method 300 of FIG. 11.

FIGS. 12-15 illustrate diagrammatic views of one embodiment of a beam monitoring system 400 that may benefit from the method 300 of FIG. 11. Examples of systems that can benefit from one or more embodiments of the present invention are systems that monitor a beam source. Such a system, for example, is a system that monitors an ion beam source. The ion beam source, for example, may be used in a manufacturing process to implant ions in semiconductor devices. The following disclosure will continue with an example of a system for monitoring an ion beam to illustrate various embodiments of the present invention. It is understood, however, that the invention should not be limited to a particular type of system, except as specifically claimed.

In the present embodiment, the beam monitoring system 400 includes a beam monitoring device 100. The beam monitoring device 100 of FIGS. 12-15 is similar in many respects to the beam monitoring device 100 of FIGS. 1-10. Accordingly, similar features in FIGS. 1-10 and 12-15 are identified by the same reference numerals for clarity and simplicity. FIGS. 12-15 have been simplified for the sake of clarity to better understand the inventive concepts of the present disclosure. Additional features can be added to the beam monitoring device 100, and some of the features described can be replaced or eliminated in other embodiments of the beam monitoring device 100.

Figure 12:
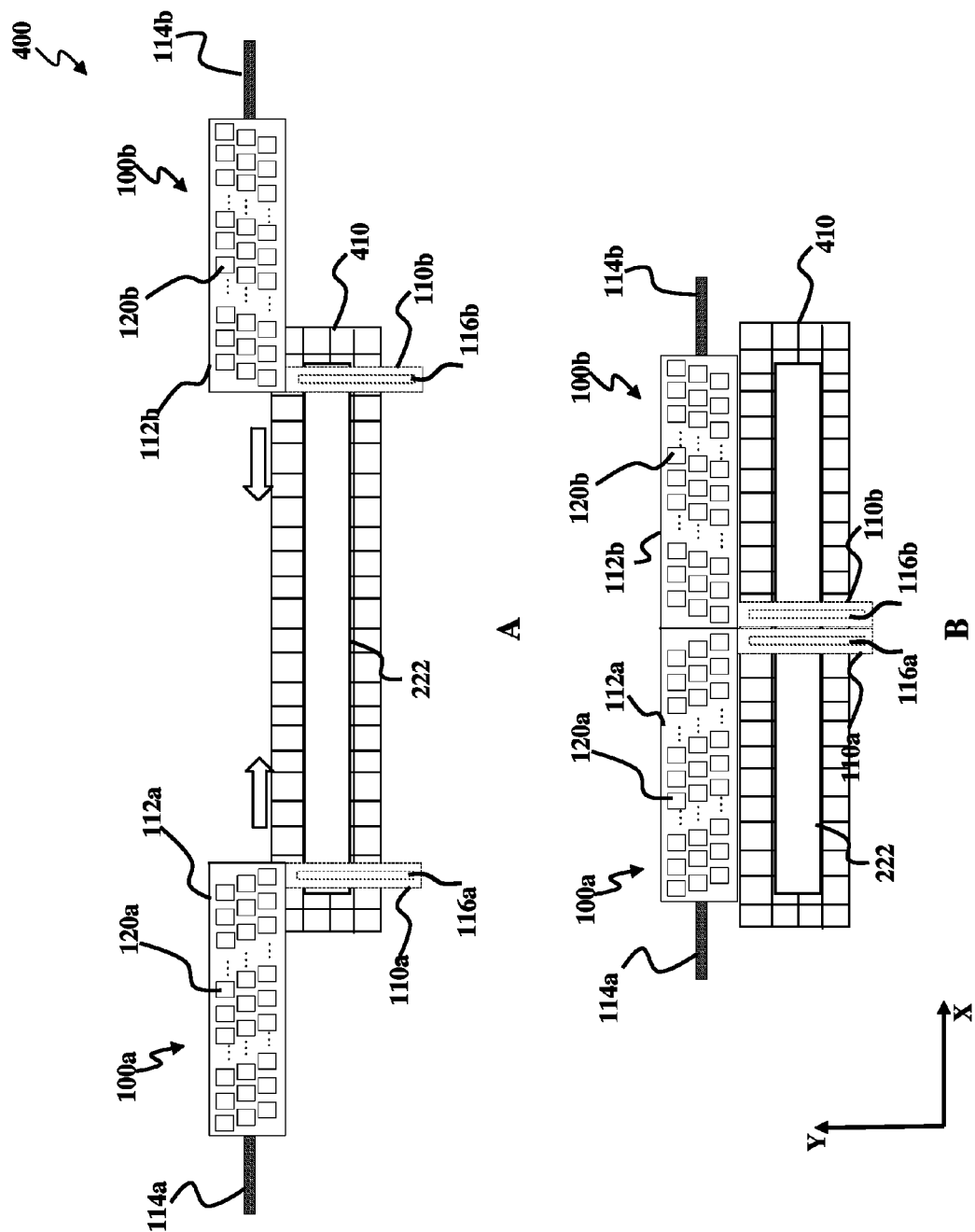
FIGS. 12-15 illustrate diagrammatic views of one embodiment of a beam monitoring system that may benefit from the method of FIG. 11.

Referring to FIG. 12 A-B, the beam monitoring system 400 includes a first and as second beam monitoring device 100a, 100b. The first monitoring device 100a includes a first 1D profiler 110a including a first 1D Faraday 116a and a first 2D profiler 112a including a first 2D Faraday 120a. The first 1D Faraday 116a has an entrance aperture which allows an ion beam to pass through and the first 2D Faraday 120a has a cup structure that captures an ion beam. The first 2D Faraday 120a of the first 2D profiler 112a is arranged in a grid pattern which may be symmetrical in nature. The second monitoring device 100b includes a second 1D profiler 110b including a second 1D Faraday 116b and a second 2D profiler 112b including a second 2D Faraday 120b. The second 1D Faraday 116b has an entrance aperture which allows an ion beam to pass through and the second 2D Faraday 120b has a cup structure that captures an ion beam. The second 2D Faraday 120b of the second 2D profiler 112b is arranged in a grid pattern which may be symmetrical in nature.

The first monitoring device 100a further includes a first control arm component 114a. In the present embodiment the first control arm component 114a is coupled to the first 2D profiler 112a. In other embodiments the first control arm component 114a is coupled to the first 1D profiler 110a. The second monitoring device 100b further includes a second control arm component 114b. In the present embodiment the second control arm component 114b is coupled to the second 2D profiler 112b. In other embodiments the second control arm component 114b is coupled to the second 1D profiler 110b. The control arm component 114a, 114b, allows movement of the monitoring device 100a, 100b during operation. The control arm component 114a, 114b, allows the monitoring device 100a, 100b, to move in longitudinal directions. Further, the control arm component 114a, 114b allows the monitoring device 100a, 100b to bi-directionally rotate about an axis.

Still referring to FIG. 12 A-B, during operation, the beam monitoring system 400 monitors a 1D cross sectional profile of an ion beam 222. The beam monitoring system 400 uses the first and second control arm components 114a, 114b to position the first and second monitoring device 100a, 100b on an ion beam 222. The ion beam 222 includes a first and a second end at opposite ends of the ion beam 222 lengthwise. The first monitoring device 100a is positioned at the first end and the second monitoring device 100b is position at the second end (opposing one another). The first monitoring device 100a is moved in the X direction along the length of the ion beam 222 towards the center of the ion beam 222 such that the first 1D profiler 110a traverses a first cross section of the ion beam 222. Traversing of the first cross section causes the ion beam 222 to pass through an opening of the first 1D Faraday 116a thereby inducing a current in the first 1D Faraday 116a which is used determine a first 1D cross sectional profile of the ion beam 222. The second monitoring device 100b is also moved in the −X direction along the length of the ion beam 222 towards the center of the ion beam 222 such that the second 1D profiler 110b traverses a second cross section of the ion beam 222. Traversing of the second cross section causes the ion beam 222 to pass through an opening of the second 1D Faraday 116b thereby inducing a current in the second 1D Faraday 116b which is used to determine a second 1D cross sectional profile of the ion beam 222. The first and second monitoring device 100a, 100b may be moved at the same time or independently one with respect to the other. In the present embodiment, the first and second monitoring device 100a, 100b are moved at the same time one toward the other. In alternative embodiments, the first and second monitoring device 100a, 100b are moved independently. In an alternative embodiment, the first and second monitoring device 100a, 100b are positioned at the center of the ion beam 222 and thereafter are moved in the X direction along the length of the ion beam 222 outwardly toward the first and second end of the ion beam 222.

Still referring to FIG. 12 A-B, during operation, the beam monitoring system 400 also monitors an incidence angle of the ion beam 222 in the direction X along the length (see FIGS. 4-6) of the ion beam 222. The incidence angle monitoring in the X direction occurs, for example, as the ion beam 222 falls through the entrance aperture of the first and second Faraday 116a, 116b of the first and second 1D profiler 110a, 110b, and onto a Faraday structure 410 positioned underneath, thereby determining a current and an angle of incidence in the X direction along the length of the ion beam 222.

Figure 13:
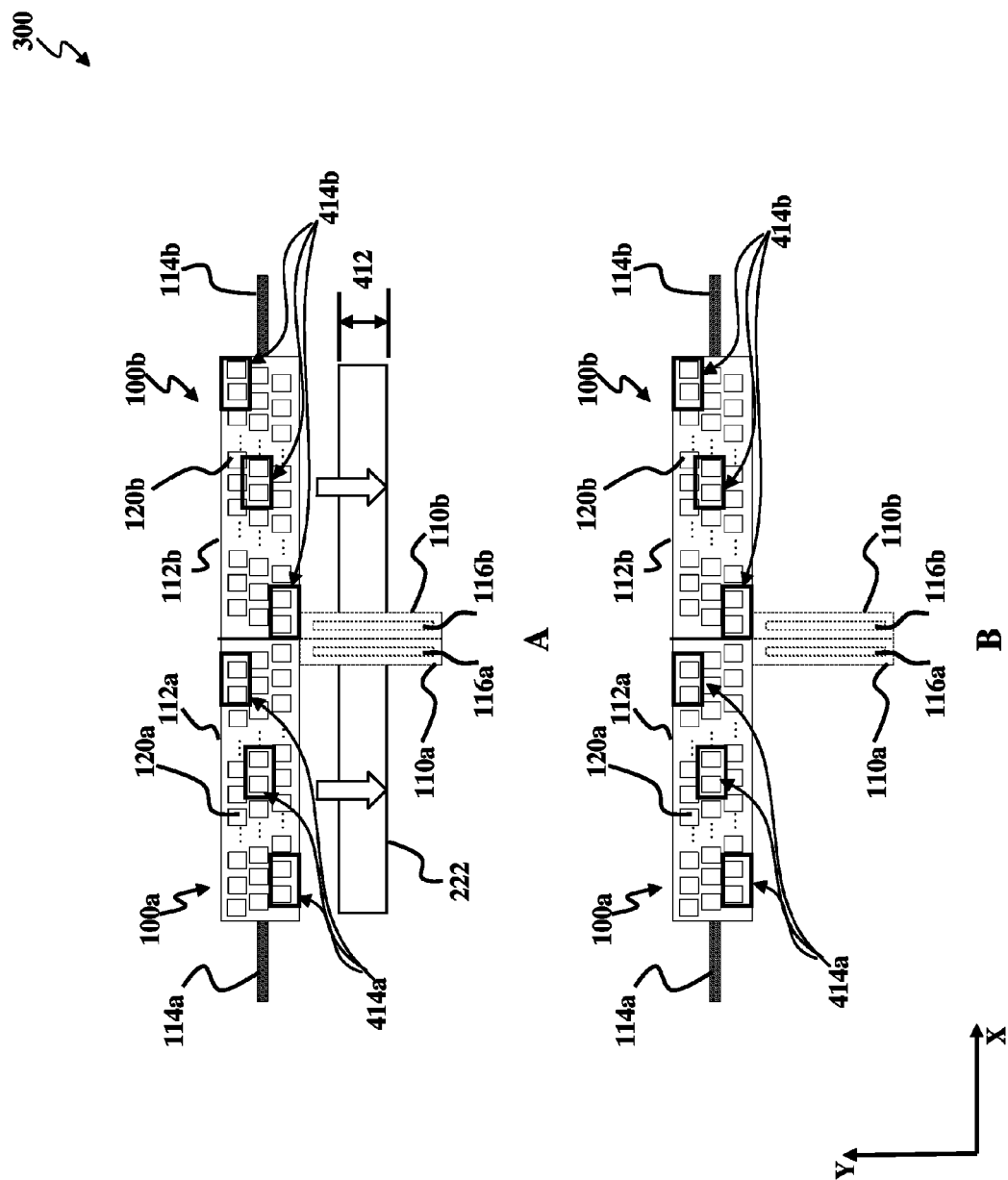

Referring to FIG. 13 A-B, during operation, the beam monitoring system 400 monitors the width 412 of the ion beam 222 and also scans a 2D cross sectional profile of the ion beam 222. The width 412 of the ion beam 222 is the ion beam 222 dimension widthwise (in the Y direction). Monitoring the width 412 of the ion beam 222 and scanning the 2D cross sectional profile of the ion beam 222, is performed, for example, by moving the first monitoring device 110a in the −Y direction along the width of the ion beam 222 such that the first 2D profiler 112a traverses the first cross section of the ion beam 222. The traversing of the first cross section causes the ion beam 222 to pass through an opening of the first 2D Faraday 120a thereby inducing a current in the first 2D Faraday 120a. The second monitoring device 100b is also moved in the −Y direction along the width of the ion beam 222 such that the second 2D profiler 112b traverses the second cross section of the ion beam 222. The traversing of the second cross section causes the ion beam 222 to pass through an opening of the second 2D Faraday 120b thereby inducing a current in the second 2D Faraday 120b.

Monitoring the width 412 of the ion beam 222 and scanning a 2D profile of the ion beam 222 may include enabling all or a select number of the first and second 2D Faraday 120a, 120b. In the present embodiment, monitoring the width 412 of the ion beam 222 and scanning a 2D profile of the ion beam 222 includes only enabling a first select Faraday 414a of the first 2D Faraday 120a and a second select Faraday 414b of the second 2D Faraday 120b. The first select Faraday 414a comprise a plurality of Faraday (denoted by boxes) that are formed in an end region and in a central region of the first 2D profiler 112a, and the second select Faraday 414b comprise a plurality of Faraday (denoted by boxes) that are formed in an end region and in a central region of the second 2D profiler 112b. In alternative embodiments, all or other select Faraday are enabled to determine the width 412 of the ion beam 222 and scan a 2D profile of the ion beam 222. It may be advantageous to enable select Faraday such that the time to process the resulting data is minimized and that the energy requirement of the system is minimized. It is understood that different embodiments may have different advantages, and no particular advantage is necessarily required of any embodiment.

Figure 14:
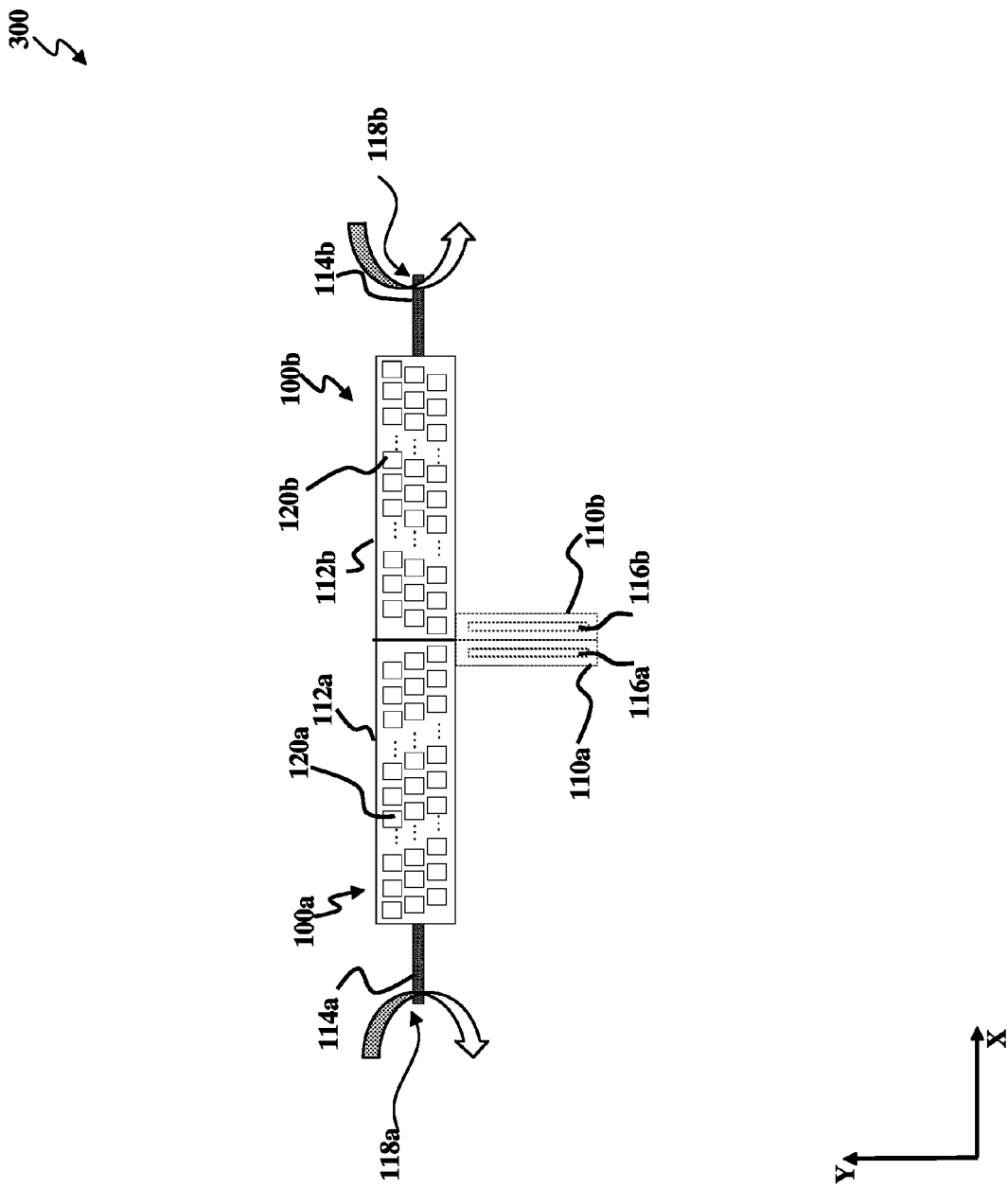

Referring to FIG. 14, during operation, the beam monitoring system 400, monitors the incidence angle of the ion beam 222 in the Y direction along the width of the ion beam 222 (see FIGS. 4-10). The incidence angle in the Y direction along the width of the ion beam 222 is monitored, for example, by rotating the first and second monitoring device 100a, 100b, about a first and second axis 118a, 118b, such that the first and second 2D profiler 112a, 112b, traverse an angle of the ion beam (222 not shown as covered) across the first and second cross section of the ion beam 222.

Figure 15:
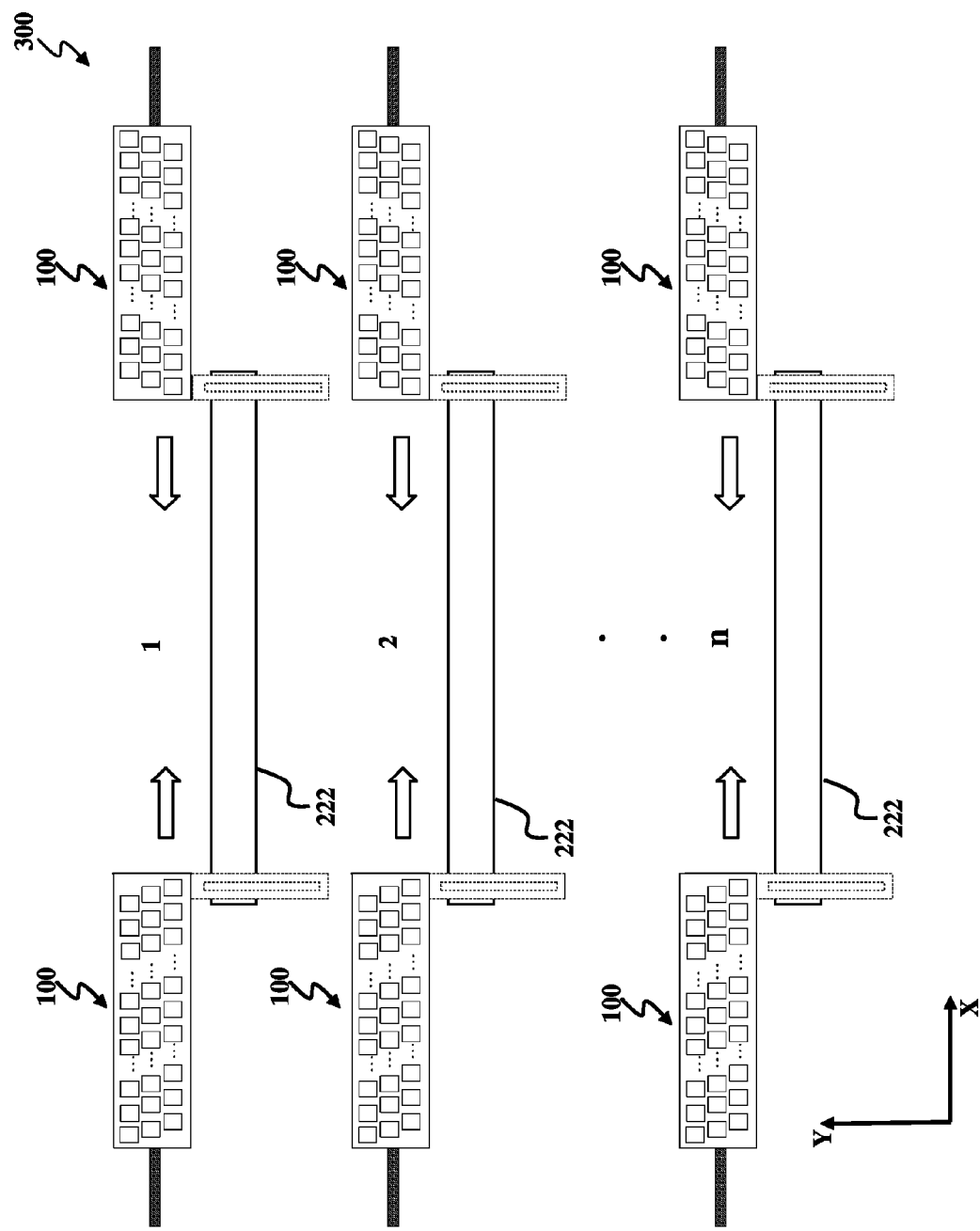

Referring to FIG. 15, the beam monitoring system 400 may include a n-number of ion beams (see FIG. 3) and a n-number of monitoring devices 100 depending on manufacturing process design requirements. In the present embodiment, the n-number of monitoring devices 100 are substantially similar to the monitoring device 100 of FIG. 1-14 in terms of composition, formation and configuration.

After monitoring the ion beam according to the embodiments disclosed herein, data regarding the 1D cross section profile, the 2D cross section profile, the beam width, and the angle of incidence along the width and length of the beam may be used to calibrate the ion beam generating units to better control the implantation process during manufacturing. Further, the monitored data may further be used during the implantation process to change the angle of the wafer during implantation to better control the implantation process during manufacturing. Accordingly, the above disclosed device, method, and system provide benefits by enabling monitoring of a beam to better control various process during manufacturing. Further, the device, method, and system disclosed herein is easily implemented into current processing. It is understood that different embodiments may have different advantages, and no particular advantage is necessarily required of any embodiment.

Thus, provided is a beam monitoring device. An exemplary beam monitoring device includes a one dimensional (1D) profiler. The 1D profiler includes a Faraday having an insulation material and a conductive material. The beam monitoring device further includes a two dimensional (2D) profiler. The 2D profiler includes a plurality of Faraday having an insulation material and a conductive material. The beam monitoring device further includes a control arm. The control arm is operable to facilitate movement of the beam monitoring device in a longitudinal direction and to facilitate rotation of the beam monitoring device about an axis.

In certain embodiments, the Faraday of the 1D profiler has an entrance aperture that allows a beam to pass through. In various embodiments, each of the plurality of Faraday of the 2D profiler have an entrance aperture and a plurality of walls extending down in the conductive material to a bottom surface opposite the entrance aperture. In one embodiment, the insulation material of the Faraday of the 1D profiler covers the conductive material not exposed by the entrance aperture. In some embodiments, the insulation material of the plurality of Faraday of the 2D profiler covers the conductive material not exposed by the entrance aperture. In certain embodiments, the entrance aperture allows a beam to enter the plurality of Faraday of the 2D profiler and strike the bottom surface and the plurality of walls extending down in the conductive material and thereby induce a current. In further embodiments, the plurality of Faraday of the 2D profiler are arranged in a grid pattern such that the Faraday are offset one to another in a first direction and substantially aligned in a second direction. In an embodiment, the 2D profiler has a first dimension and a second dimension, the first and second dimension being different, wherein the 2D profiler first dimension is at least half of a beam first dimension, and wherein the 2D profiler second dimension is at least a beam second dimension, wherein the beam first and second dimensions are different. In various embodiments, the first dimension of the 2D profiler is at least half of a diameter of a wafer. In further embodiments, the control arm is coupled to the 2D profiler at an end opposite of the 1D profiler Also provided is a method. The method includes providing a first and a second beam monitoring device. The first beam monitoring device includes a first 1D profiler and a first 2D profiler and the second beam monitoring device includes a second 1D profiler and a second 2D profiler. The first 1D profiler includes a first 1D Faraday and the first 2D profiler includes a first 2D Faraday and the second 1D profiler includes a second 1D Faraday and the second 2D profiler includes a second 2D Faraday. The method further includes scanning a beam having a first dimension and a second dimension. Scanning the beam includes scanning the beam along the first dimension with the first 1D Faraday and the second 1D Faraday and scanning the beam along the second dimension with the first 2D Faraday and the second 2D Faraday. The method further includes scanning an angle of the beam with the first 2D Faraday and the second 2D Faraday.

In certain embodiments, the method further includes providing a third and a fourth beam monitoring device. The third beam monitoring device includes a third 1D profiler and a third 2D profiler and the fourth beam monitoring device includes a fourth 1D profiler and a fourth 2D profiler. The third 1D profiler includes a third 1D Faraday and the third 2D profiler includes a third 2D Faraday and the fourth 1D profiler includes a fourth 1D Faraday and the fourth 2D profiler includes a fourth 2D Faraday. In the present embodiment, the method further includes scanning another beam having a first dimension and a second dimension. Scanning the another beam includes scanning the another beam along the first dimension with the third 1D Faraday and the fourth 1D Faraday and scanning the another beam along the second dimension with the third 2D Faraday and the fourth 2D Faraday. In the present embodiment, the method further includes scanning an angle of the another beam with the third 2D Faraday and the fourth 2D Faraday.

In some embodiments, the method further includes scanning an angle of the beam as the beam falls through an entrance aperture of the first 1D Faraday and as the beam falls through an entrance aperture of the second 1D Faraday and onto a Faraday structure positioned underneath. In various embodiments, scanning the beam along the first dimension includes moving the first and second beam monitoring device in directions opposite one to another such that the first and second beam monitoring device meet in the middle of the beam. In certain embodiments, scanning the beam in the second dimension includes only enabling a first select Faraday of the first 2D Faraday and a second select Faraday of the second 2D Faraday, wherein the first select Faraday comprise a plurality of Faraday that are formed in an end region or in a central region of the first 2D profiler, and wherein the second select Faraday comprise a plurality of Faraday that are formed in an end region or in a central region of the second 2D profiler. In one embodiment, scanning the angle of the beam includes finding an angle of incidence by determining an angle that induces a maximum current in the first 2D Faraday and the second 2D Faraday, and wherein determining the angle that induces a maximum current includes bi-directionally rotating the first and second beam monitoring device about an axis. In further embodiments, scanning the angle of the beam includes measuring a current in the first 2D Faraday as the beam enters an aperture of the first 2D Faraday and strikes a conductive material and measuring a current in the second 2D Faraday as the beam enters an aperture of the second 2D Faraday and strikes a conductive material.

Also provided is a system. The system includes a first beam monitoring device and a second beam monitoring device. The first beam monitoring device includes a first 1D profiler including a first 1D Faraday and a first 2D profiler including a first 2D Faraday and the second beam monitoring device includes a second 1D profiler including a second 1D Faraday and a second 2D profiler including a second 2D Faraday. The system further includes a first control arm component coupled to the first beam monitoring device and a second control arm component coupled to the second beam monitoring device. The first control arm component is configured to: move the first beam monitoring device along the length of a beam such that the first 1D profiler traverses a first cross section of the beam, wherein traversing of the first cross section causes the beam to pass through an opening of the first 1D Faraday thereby inducing a current in the first 1D Faraday; move the first beam monitoring device along the width of the beam such that the first 2D profiler traverses the first cross section of the beam, wherein the traversing of the first cross section causes the beam to pass through an opening of the first 2D Faraday thereby inducing a current in the first 2D Faraday; and rotate the first beam monitoring device about a first axis such that the first 2D profiler traverses an angle of the beam across the first cross section of the beam. The second control arm component is configured to: move the second beam monitoring device along the length of the beam such that the second 1D profiler traverses a second cross section of the beam, wherein traversing of the second cross section causes the beam to pass through an opening of the second 1D Faraday thereby inducing a current in the second 1D Faraday; move the second beam monitoring device along the width of the beam such that the second 2D profiler traverses the second cross section of the beam, wherein the traversing of the second cross section causes the beam to pass through an opening of the second 2D Faraday thereby inducing a current in the second 2D Faraday; and rotate the second beam monitoring device about a second axis such that the second 2D profiler monitors an angle of the beam across the second cross section of the beam.

In some embodiments, the first control arm component is coupled to the first 2D profiler and the second control arm component is coupled to the second 2D profiler. In certain embodiments, moving the first and second beam monitoring device along the length of the beam includes moving the first and second beam monitoring device in a direction opposite one to another such that the first 1D profiler and the second 1D profiler meet in a central region of the beam.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A beam monitoring device comprising:
   a one dimensional (1D) profiler, wherein the 1D profiler includes a Faraday having an insulation material and a conductive material;
   a two dimensional (2D) profiler, wherein the 2D profiler includes a plurality of Faraday having an insulation material and a conductive material; and
   a control arm, wherein the control arm is operable to facilitate movement of the beam monitoring device in a first longitudinal direction and in a second longitudinal direction different from the first longitudinal direction, and wherein the control arm is operable to facilitate rotation of the beam monitoring device about an axis.

2. The beam monitoring device of claim 1 wherein the Faraday of the 1D profiler has an entrance aperture that allows a beam to pass through.

3. The beam monitoring device of claim 1 wherein each of the plurality of Faraday of the 2D profiler have an entrance aperture and a plurality of walls extending down in the conductive material to a bottom surface opposite the entrance aperture.

4. The beam monitoring device of claim 2 wherein the insulation material of the Faraday of the 1D profiler covers the conductive material not exposed by the entrance aperture.

5. The beam monitoring device of claim 3 wherein the insulation material of the plurality of Faraday of the 2D profiler covers the conductive material not exposed by the entrance aperture.

6. The beam monitoring device of claim 3 wherein the entrance aperture allows a beam to enter the plurality of Faraday of the 2D profiler and strike the bottom surface and the plurality of walls extending down in the conductive material and thereby induce a current.

7. The beam monitoring device of claim 1 wherein the plurality of Faraday of the 2D profiler are arranged in a grid pattern such that the Faraday are offset one to another in a first direction and substantially aligned in a second direction.

8. The beam monitoring device of claim 1 wherein the 2D profiler has a first dimension and a second dimension, the first and second dimension being different, wherein the 2D profiler first dimension is at least half of a beam first dimension, and wherein the 2D profiler second dimension is at least a beam second dimension, wherein the beam first and second dimensions are different.

9. The beam monitoring device of claim 8 wherein the first dimension of the 2D profiler is at least half of a diameter of a wafer.

10. The beam monitoring device of claim 1 wherein the control arm is coupled to the 2D profiler at an end opposite of the 1D profiler.

11. A method comprising:
   providing a first and a second beam monitoring device, the first beam monitoring device including a first 1D profiler and a first 2D profiler and the second beam monitoring device including a second 1D profiler and a second 2D profiler, wherein the first 1D profiler includes a first 1D Faraday and the first 2D profiler includes a first 2D Faraday, and wherein the second 1D profiler includes a second 1D Faraday and the second 2D profiler includes a second 2D Faraday;
   scanning a beam having a first dimension and a second dimension, wherein scanning the beam includes scanning the beam along the first dimension with the first 1D Faraday and the second 1D Faraday and scanning the beam along the second dimension with the first 2D Faraday and the second 2D Faraday; and
   scanning an angle of the beam with the first 2D Faraday and the second 2D Faraday.

12. The method of claim 11 further comprising:
   providing a third and a fourth beam monitoring device, the third beam monitoring device including a third 1D profiler and a third 2D profiler and the fourth beam monitoring device including a fourth 1D profiler and a fourth 2D profiler, wherein the third 1D profiler includes a third 1D Faraday and the third 2D profiler includes a third 2D Faraday, and wherein the fourth 1D profiler includes a fourth 1D Faraday and the fourth 2D profiler includes a fourth 2D Faraday;
   scanning another beam having a first dimension and a second dimension, wherein scanning the another beam includes scanning the another beam along the first dimension with the third 1D Faraday and the fourth 1D Faraday and scanning the another beam along the second dimension with the third 2D Faraday and the fourth 2D Faraday; and scanning an angle of the another beam with the third 2D Faraday and the fourth 2D Faraday.

13. The method of claim 11 further comprising:

scanning an angle of the beam as the beam falls through an entrance aperture of the first 1D Faraday and as the beam falls through an entrance aperture of the second 1D Faraday and onto a Faraday structure positioned underneath.

14. The method of claim 11 wherein scanning the beam along the first dimension includes moving the first and second beam monitoring device in directions opposite one to another such that the first and second beam monitoring device meet in the middle of the beam.

15. The method of claim 11 wherein scanning the beam in the second dimension includes only enabling a first select Faraday of the first 2D Faraday and a second select Faraday of the second 2D Faraday, wherein the first select Faraday comprise a plurality of Faraday that are formed in an end region or in a central region of the first 2D profiler, and wherein the second select Faraday comprise a plurality of Faraday that are formed in an end region or in a central region of the second 2D profiler.

16. The method of claim 11 wherein scanning the angle of the beam includes finding an angle of incidence by determining an angle that induces a maximum current in the first 2D Faraday and the second 2D Faraday, and wherein determining the angle that induces a maximum current includes bi-directionally rotating the first and second beam monitoring device about an axis.

17. The method of claim 11 wherein scanning the angle of the beam includes measuring a current in the first 2D Faraday as the beam enters an aperture of the first 2D Faraday and strikes a conductive material and measuring a current in the second 2D Faraday as the beam enters an aperture of the second 2D Faraday and strikes a conductive material.

18. A system comprising:

a first beam monitoring device and a second beam monitoring device, wherein the first beam monitoring device includes a first 1D profiler including a first 1D Faraday and a first 2D profiler including a first 2D Faraday, wherein the second beam monitoring device includes a second 1D profiler including a second 1D Faraday and a second 2D profiler including a second 2D Faraday;

a first control arm component coupled to the first beam monitoring device; and a second control arm component coupled to the second beam monitoring device, wherein the first control arm component is configured to:

move the first beam monitoring device along the length of a beam such that the first 1D profiler traverses a first cross section of the beam, wherein traversing of the first cross section causes the beam to pass through an opening of the first 1D Faraday thereby inducing a current in the first 1D Faraday;

move the first beam monitoring device along the width of the beam such that the first 2D profiler traverses the first cross section of the beam, wherein the traversing of the first cross section causes the beam to pass through an opening of the first 2D Faraday thereby inducing a current in the first 2D Faraday; and rotate the first beam monitoring device about a first axis such that the first 2D profiler traverses an angle of the beam across the first cross section of the beam;

wherein the second control arm component is configured to:

move the second beam monitoring device along the length of the beam such that the second 1D profiler traverses a second cross section of the beam, wherein traversing of the second cross section causes the beam to pass through an opening of the second 1D Faraday thereby inducing a current in the second 1D Faraday;

move the second beam monitoring device along the width of the beam such that the second 2D profiler traverses the second cross section of the beam, wherein the traversing of the second cross section causes the beam to pass through an opening of the second 2D Faraday thereby inducing a current in the second 2D Faraday; and rotate the second beam monitoring device about a second axis such that the second 2D profiler monitors an angle of the beam across the second cross section of the beam.

19. The system of claim 18 wherein the first control arm component is coupled to the first 2D profiler, and wherein the second control arm component is coupled to the second 2D profiler.

20. The system of claim 18 wherein moving the first and second beam monitoring device along the length of the beam includes moving the first and second beam monitoring device in a direction opposite one to another such that the first 1D profiler and the second 1D profiler meet in a central region of the beam.

* * * * *